United States Patent [19]

Hayashi

[11] Patent Number: 5,391,457
[45] Date of Patent: Feb. 21, 1995

[54] PREPARATION OF LITHOGRAPHIC PRINTING PLATE WITH THIOETHER SOLVENTS

[75] Inventor: Katsumi Hayashi, Kanagawa, Japan

[73] Assignee: Fuji Photo Film Co., Ltd, Kanagawa, Japan

[21] Appl. No.: 970,810

[22] Filed: Nov. 3, 1992

[30] Foreign Application Priority Data

Nov. 5, 1991 [JP] Japan ................... 3-317425

[51] Int. Cl.$^6$ .................................... G03C 5/54
[52] U.S. Cl. ..................... 430/204; 430/251; 430/455; 430/456
[58] Field of Search ............. 430/204, 251, 455, 456, 430/459

[56] References Cited

U.S. PATENT DOCUMENTS

| H 953 | 8/1991 | Goto et al. | 430/455 |
|---|---|---|---|
| 3,721,559 | 3/1973 | De Haes et al. | 430/204 |
| 4,267,254 | 5/1981 | Bloom et al. | 430/251 |
| 4,272,532 | 6/1981 | Sachdev et al. | 430/251 |
| 4,353,976 | 10/1982 | Bloom et al. | 430/251 |
| 4,563,410 | 1/1986 | De Jaeger et al. | 430/204 |
| 4,695,535 | 9/1987 | Bryan et al. | 430/455 |
| 5,059,508 | 10/1991 | Vaes et al. | 430/204 |
| 5,153,097 | 10/1992 | Nishinoiri et al. | 430/204 |
| 5,200,294 | 4/1994 | De Keyzer et al. | 430/204 |

FOREIGN PATENT DOCUMENTS

| 0481562 | 4/1992 | European Pat. Off. . |
|---|---|---|
| 4109563 | 9/1991 | Germany . |
| WO900360 | 4/1990 | WIPO . |

OTHER PUBLICATIONS

AN 92-042600/06 Dec. 1987
AN 87-335449/48 Dec. 1987
AN 87-253949/36 Aug. 1987.
AN 84-232387/38 Sep. 1984.
AN 79-22891B8/12 Feb. 1979.
AN 92-222757/27 May. 1992.
AN 86-039816/06 Jan. 1986.
AN 81-36563D/21 May 1981.
AN 91-348031/48 Nov. 1981.
AN 88-010469/02 May 1986.
AN 87-335448/48 Sep. 1987.
AN 86-253332/39 Sep. 1986.
An 84-216323/35 Jul. 1984.
AN 92-327712/40 Aug. 1992.
AN 92-222756/27 May 1992.
AN 85-101135/17 Apr. 1985.
AN 76-35941X/20, Apr. 1976.
AN 90-234077/31 Jun. 1990.
AN 87-356393/51 Jun. 1987.
AN 87-289535/41 Sep. 1987.
AN 85-290724/47 Nov. 1985.
AN 81-95650D/52 Nov. 1981.
AN 92-230828/28 May. 1992.
AN 91-076265/11 Jan. 1991.
AN 82-20383E/11 Mar. 1982.

Primary Examiner—Richard L. Schilling
Attorney, Agent, or Firm—Sughrue, Mion, Zinn, Macpeak & Seas

[57] ABSTRACT

A lithographic printing plate is prepared from a photosensitive material comprising a silver halide emulsion layer and a physical development nucleus layer on a support in accordance with a silver complex diffusion transfer process. The photosensitive material is diffusion transfer processed in the presence of both a triazole, oxadiazole or similar compound and an organic thioether compound. The printing plate has good ink receptivity and minimized plate wear. The processing solution is free from the problems of corrosion and waste solution disposal.

1 Claim, No Drawings

PREPARATION OF LITHOGRAPHIC PRINTING PLATE WITH THIOETHER SOLVENTS

FIELD OF THE INVENTION

This invention relates to a method for preparing a lithographic printing plate in accordance with a silver complex diffusion transfer process.

BACKGROUND OF THE INVENTION

In general, a lithographic or planographic printing plate includes a lipophilic image area capable of receiving greasy ink and an oil-repellent non-image area which is incapable of receiving ink, but sufficiently hydrophilic to receive water. Lithographic printing is usually carried out by supplying both water and ink to the plate surface so that the image area receives the coloring ink and the non-image area receives water both preferentially whereupon the ink on the image area is transmitted to an ink-receptive sheet, typically paper. For obtaining satisfactory printed matter, it is necessary that there is sufficient differential affinity to oil and water between the image and background non-image areas to ensure that upon supply of water and ink, the image area receives an amount of ink, but the non-image area does not receive the ink at all.

Lithographic printing plates are often prepared by a silver complex diffusion transfer process (DTR). One of their drawbacks is low wear resistance in that the plate is less resistant against mechanical wear so that the hydrophobic area for bearing an ink image may gradually lose its ink receptivity. Another drawback is that the hydrophilic area gradually becomes hydrophobic while the non-image or background area becomes scummed with ink. Further, the hydrophobic image area experiences local losses of even receptivity to greasy ink and thus becomes variant in ink receptivity, resulting in a varying amount of ink being received thereon during printing.

There are known printing plates which utilize a metallic silver pattern formed by DTR process as an ink-receptive site. See U.S. Pat. Nos. 3,220,837 and 3,721,559, Japanese Patent Publication (JP-B) Nos. 16725/1973 and 30562/1973, and Japanese Patent Application Kokai (JP-A) Nos. 4482/1971 and 21603/1978. Some of these printing plates have been used in practice, but not free from the above-mentioned drawbacks.

Like other lithographic printing plates, those plates relying on DTR process are required to enhance plate wear resistance by tailoring the composition of plate material and processing solution and printing conditions. The state of transfer developed silver grains is one of important factors dictating the printing characteristics of plates.

Factors critical for silver grains transfer developed by DTR process to be more resistant against printing wear are conditions of forming transfer silver grains, for example, the diffusion rate, stability and reduction rate of the silver complex, and moreover the size and shape of the thus developed silver grains although other components of the lithographic printing plate have more or less influence.

A number of silver halide complexing agents are known for use in the development step of diffusion transfer process. Examples include (1) thiosulfate salts, (2) thiocyanate salts, (3) aminothiosulfates as disclosed in U.S. Pat. No. 3,169,992, (4) cyclic imide compounds as disclosed in U.S. Pat. No. 2,857,276, (5) 2-mercaptobenzoic acids as disclosed in JP-B 4099/1986, and (6) thiosalicylic acids and cyclic imide compounds having a five or six-membered ring as disclosed in JP-B 4100/1986. Printing plates which are prepared through development with such silver halide complexing agents have the advantages of high sensitivity, high resolution, and high image reproducibility, but are prone to plate wear as compared with other practical printing plates such as presensitized plates. It is thus desired to improve the plate wear of such plating plates.

Among the above-mentioned silver halide complexing agents, thiocyanates are best with respect to the printing wear resistance of transfer developed silver grains and cost. This procedure, however, has several problems including (1) corrosion in that thiocyanates are metal corrosive and thus tend to attack parts of the processing equipment, (2) restricted solution disposal in that thiocyanate solution is classified as cyan-containing solution according to the waste water regulation and must be deliberately treated before discarding to the environment, (3) cumbersomeness in that thiocyanates are deliquescent so that their handling is difficult and their processing solution requires care during preparation, (4) careful management of processing solution in that ink-receptivity largely depends on the amount of thiocyanate added.

SUMMARY OF THE INVENTION

A primary object of the present invention is to provide an improved method for preparing a lithographic printing plate featuring high ink-receptivity, little or no scumming, and outstandingly reduced plate wear. Another object of the present invention is to provide such a lithographic printing plate preparing method using a diffusion transfer processing solution which has eliminated the corrosion and solution disposal problems and is easy to handle and manage.

According to the present invention, there is provided a method for preparing a lithographic printing plate from a photosensitive material comprising at least a silver halide emulsion layer and a physical development nucleus layer on a support in accordance with a silver complex diffusion transfer process. The photosensitive material is diffusion transfer processed in the presence of a compound of formula (I) and a compound of formula (II), thereby forming a lithographic printing plate utilizing the transferred silver as an ink receptive site. The compounds used herein are defined below.

Z represents a group of atoms necessary to form a five- or six-membered heterocyclic ring with the nitrogen and carbon atoms, and R is selected from the group consisting of a hydrogen atom, alkyl radical, aryl radical and aralkyl radical.

$R^1$ and $R^2$ are independently alkyl radicals or $R^1$ and $R^2$, taken together, form a ring, $R^3$ is an alkylene radical which may have an intervening divalent radical, and letter m is 0 or an integer of from 1 to 4, the R³ radicals may be the same or different where m is 2 or more.

Preferably, the photosensitive material is processed with a diffusion transfer processing solution containing a compound of formula (I) and a compound of formula (II).

DETAILED DESCRIPTION OF THE INVENTION

The photosensitive material used in the present invention includes at least a silver halide emulsion layer and a physical development nucleus layer or image-receptive layer on a support. The photosensitive material is processed by a silver complex diffusion transfer process to form a silver image thereon whereby it is ready for use as a lithographic or planographic printing plate.

This silver complex diffusion transfer processing, also known as development, is carried out in the presence of at least one compound of formula (I) and at least one compound of formula (II). Preferably, these compounds are used in the form of a diffusion transfer processing solution or developer containing them. Additionally, these compounds may also be contained in a bath subsequent to the developer bath, that is, in a stabilizing or neutralizing solution.

The combined use of compounds of formulae (I) and (II) is effective in significantly improving ink receptivity and plate wear. This benefit can be accomplished only when these two compounds are used together, but not when either one of the two compounds is used.

The compound of formula (I) plays the main role of enhancing ink receptivity by adsorbing to a physically developed silver image. On the other hand, the compound of formula (II) plays the role of a silver halide complexing agent or silver halide dissolving agent which is effective in dissolving the silver halide in the emulsion layer where no latent image has been formed by imagewise exposure. This dissolution takes place by way of formation of a soluble silver complex salt, which is concurrently diffused into the physical development nucleus layer or surface layer for forming a silver image on physical development nuclei by virtue of the reducing force of the developing agent. In this process, the compound of formula (II) helps the physically developed silver be more ink receptive.

The compound of formula (I) is an additive commonly applied to printing plates using silver salts and added to a developer or etching solution used during printing in the prior art. However, it is unknown to use the compound of formula (I) together with the compound of formula (II) in a diffusion transfer process, especially in a diffusion transfer processing solution.

On the other hand, it is known from U.S. Pat. Nos. 4,211,562 and 4,267,254 that the compound of formula (II) is used as a silver halide solvent in a conventional diffusion transfer process for the purposes of increasing transfer density and improving color tone. However, these patents suggest nowhere to use the compound of formula (II) in forming silver images for preparing printing plates in accordance with superposing layer diffusion transfer process.

Further, French Patent No. 2,071,072 discloses the preparation of printing plates having lipophilic silver images formed by exposure and development wherein the plates are treated with a stop bath containing a compound capable of forming a complex with silver such as polyethylene glycol and organic thioethers for improving the plate wear resistance. Although organic thioethers among the disclosed compounds correspond to the compounds of formula (II), this patent does not teach to use the compound of formula (II) in a diffusion transfer process, especially in a diffusion transfer processing solution as a silver halide solvent. Of course, it is suggested nowhere to use the compound of formula (II) together with the compound of formula (I).

Now the compounds of formula (I) are described in detail.

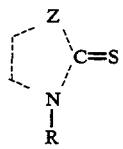
(I)

In formula (I), Z represents a group of atoms necessary to form a five- or six-membered heterocyclic ring with the nitrogen and carbon atoms, and R is selected from the group consisting of a hydrogen atom, alkyl radical, aryl radical and aralkyl radical. Where R is hydrogen, the compounds of formula (I) which is represented in thioketo form have tautomerism and thus may also be represented in thioenol form as given by the following formula.

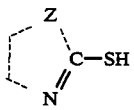
(III)

The five- or six-membered heterocyclic rings formed by Z with the nitrogen and carbon atoms include imidazole, imidazoline, thiazole, thiazoline, oxazole, oxazoline, pyrazoline, triazole, thiadiazole, oxadiazole, tetrazole, pyridine, pyrimidine, pyridazine, pyrazine, triazine and analogous rings, which may have a substituent at any attachable position. These rings may also be fused rings. In this regard, two or more of these rings may be fused together or one of these rings may be fused with a benzene or naphthalene ring which may have a substituent.

In formula (I), R is a hydrogen atom, an alkyl radical having up to 12 carbon atoms such as dodecyl and methyl, an aryl radical such as phenyl, or an aralkyl radical such as benzyl.

Typical examples of the compound of formula (I) are given below.

2-mercapto-4-phenylimidazole,
2-mercapto-1-benzylimidazole,
2-mercapto-1-ethylbenzimidazole,
2,2'-dimercapto-1,1'-decamethylenedimidazoline,
2-mercapto-4-phenylthiazole,
2-mercaptobenzothiazole,
3-dodecylbenzothiazoline-2-thion,
2-mercapto-4,5-diphenyloxazole,
1-phenyl-3-methylpyrazoline-5-thion,
3-mercapto-4-allyl-5-pentadecyl-1,2,4-triazole,
3-mercapto-5-nonyl-1,2,4-triazole,
2-mercapto-5-phenyl-1,3,4-thiadiazole,
2-mercapto-5-phenyl-1,3,4-oxadiazole,
2-mercapto-1,3,4-oxadiazole,
2-mercapto-5-methyl-1,3,4-oxadiazole,
2-mercapto-3-ethyl-1,3,4-oxadiazole,
2-mercapto-5-propyl-1,3,4-oxadiazole,
2-mercapto-5-hexyl-1,3,4-oxadiazole, 2-mercapto-5-heptyl-1,3,4-oxadiazole,
3-mercapto-4-benzamido-1,2,4-triazole,
3-mercapto-4-phenylacetamido-5-methyl-1,2,4-triazole,
3-mercapto-4-amino-5-phenyl-1,2,4-triazole,
3-mercapto-4-toluenesulfonamido-5-phenyl-1,2,4-triazole,
3-mercapto-4-acetamido-5-heptyl-1,2,4-triazole,
3-mercapto-4-benzamido-5-heptyl-1,2,4-triazole,
3-mercapto-4-phenylacetamido-5-heptyl-1,2,4-triazole,
3-mercapto-4-amino-5-nonyl-1,2,4-triazole,
3-mercapto-4-acetamido-5-nonyl-1,2,4-triazole,
3-mercapto-4-acetamido-5-pentadecyl-1,2,4-triazole,
5-mercapto-1-phenyltetrazole,
2-mercapto-5-nitropyridine,
1-methyl-quinoline-2(1H)-thion,
2-mercapto-4-hydroxy-6-pentadecylpyridine,
3-mercapto-4-methyl-6-phenylpyridazine,
2-mercapto-5,6-diphenylpyrazine,
2-mercapto-4,6-diphenyl-1,3,5-triazine,
2-amino-4-mercapto-6-benzyl-1,3,5-triazine,
1,5-dimercapto-3,7-diphenyl-8-triazolino-[1,2-a]-8-triazoline, etc.

Preferred among these are compounds of the following formulae.

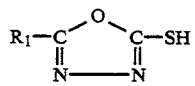 (IV)

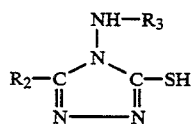 (V)

In the formula (IV), $R_1$ is a hydrogen atom, an alkyl radical such as methyl, ethyl, propyl, hexyl and heptyl, an aryl radical such as phenyl, or an aralkyl radical such as benzyl. In formula (V), $R_2$ is a hydrogen atom, an alkyl radical such as methyl, heptyl and nonyl, an aryl radical such as phenyl, or an aralkyl radical such as benzyl; and $R_3$ is a hydrogen atom, an acyl radical such as acetyl, benzoyl and phenylacetyl, or an arylsulfonyl radical such as toluenesulfonyl.

Examples of the compound of formula (IV) or (V) are 2-mercapto-1,3,4-oxadiazoles and 3-mercapto-1,2,4-triazoles having a NH radical which are enumerated above.

The compounds of formula (I) are used alone or in admixture of two or more, preferably as a diffusion transfer processing solution. The amount of formula (I) compound used is not the same for all the compounds although they are preferably used in a concentration of about 0.01 to 5 g/liter, more preferably about 0.05 to 2 g/liter. The solvent is most often an aqueous medium buffered to pH 4 to 8 although water-miscible solvents such as acetone, methanol, ethanol, propanol, isopropanol, ethylene glycol and glycerin may be used for the purpose of increasing the solubility of the compound.

According to the present invention, the compound of formula (I) is used in combination with the compound of formula (II), which is now described in detail.

In formula (II), $R^1$ and $R^2$, which may be identical or different, each are lower alkyl radicals preferably having 1 to 5 carbon atoms or substituted alkyl radicals having 1 to 30 carbon atoms in total. The substituents on the alkyl radicals include, for example, —OH, —COOM, —$SO_3$M, —$NHR^4$, —$NR^4R^4$ where $R^4$s may be identical or different, —$OR^4$, —$CONHR^4$, —$COOR^4$, and heterocyclic rings. $R^4$ is a hydrogen atom, a lower alkyl radical or a substituted alkyl radical having a substituent as just described. There may be more than one substituent which may be identical or different. M is a hydrogen atom or a cation such as alkali metal ion and ammonium ion. Further $R^1$ and $R^2$, taken together, may form a ring, typically a cyclic thioether.

$R^3$ is an alkylene radical preferably having 1 to 12 carbon atoms. Intermediate the alkylene radical, there may intervene one or more divalent radicals such as —O—, —CONH— and —$SO_2$NH—. The alkylene radical may have a substituent as mentioned for $R^1$ and $R^2$.

Letter m is 0 or an integer of from 1 to 4. The $R^3$ radicals may be identical or different where m is 2 or more.

Illustrative, non-limiting examples of the compound of formula (II) are given below.

II-1 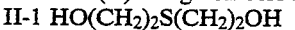
II-2 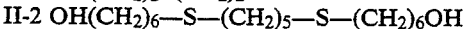
II-3 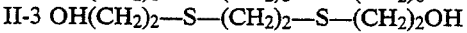
II-4 
II-5 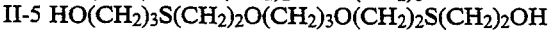
II-6 
II-7 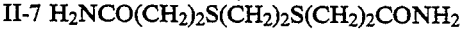

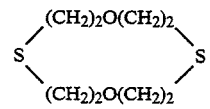 II-8

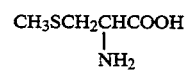 II-9

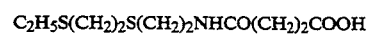 II-10

The compounds of formula (II) or organic thioethers are used alone or in admixture of two or more, preferably as a diffusion transfer processing solution. The amount of formula (II) compound used is preferably about 0.1 to 100 g/liter, more preferably about 1 to 50 g/liter.

In addition to the formula (II) compound, another silver halide complexing agent may be used together insofar as the benefits of the invention are not lost. Examples of the other silver halide complexing agent which can be used together include thiosulfates such as sodium thiosulfate, thiocyanates such as potassium thiocyanate, aminothiosulfates as disclosed in U.S. Pat. No. 3,169,992, cyclic imide compounds as disclosed in U.S. Pat. No. 2,857,276, 2-mercaptobenzoic acids as disclosed in JP-B 4099/1986, thiosalicylic acids and cyclic imide compounds having a five- and six-membered ring as disclosed in JP-B 4100/1986.

The diffusion transfer processing solution used herein is an alkaline processing solution which is preferably prepared by adding formula (I) and (II) compounds to a composition essentially comprising an alkali buffer agent and a sulfite salt. The alkaline processing solution is generally used at pH 10 or higher, desirably pH 12 or higher. A developing agent may be contained in either the alkaline processing solution or the printing material.

The developing agent used herein is preferably a dihydroxybenzene, more preferably a combination of a dihydroxybenzene with a 1-phenyl-3-pyrazolidone or a combination of a dihydroxybenzene with a p-aminophenol for enhanced development capacity. Exemplary dihydroxybenzene developing agents are hydroquinone and chlorohydroquinone, with hydroquinone being preferred. Examples of the 1-phenyl-3pyrazolidone developing agent include 1-phenyl-3-pyrazolidone, 1-phenyl-4,4-dimethyl-3-pyrazolidone, and 1-phenyl-4-methyl-4-hydroxymethyl-3-pyrazolidone. Examples of the p-aminophenol developing agent include N-methyl-p-aminophenol, p-aminophenol, N-($\beta$-hydroxyethyl)-p-aminophenol, with N-methyl-p-aminophenol being preferred.

In addition to the above ingredients, the alkaline processing solution may further contain an alkali buffer agent such as sodium hydroxide, potassium hydroxide, sodium tertiary phosphate, and sodium carbonate; a sulfite such as sodium sulfite; and optionally, a thickener such as hydroxyethyl cellulose and carboxymethyl cellulose; an antifoggant such as potassium bromide; and polyoxyalkylene compounds and onium compounds.

The photosensitive material which is processed into a lithographic printing plate in accordance with the present invention includes a silver halide emulsion which contains silver chloride, silver bromide, silver chlorobromide, or a mixture thereof with silver iodide, preferably silver halide containing at least 50 mol % of silver chloride. No particular limit is imposed on the size, crystal habit, distribution and other factors of silver halide grains. The silver halide emulsion may be prepared by any desired one of conventional processes well-known in the photographic art. The silver halide emulsion may be sensitized by any well-known chemical sensitization process or spectrally sensitized in blue, green and red. Further, commonly used emulsion additives, for example, antifoggants, stabilizers, developing agents, hardeners, and matte agents may be added if desired. The preferred binder for the silver halide emulsion is gelatin although the gelatin may be partially or entirely replaced by another natural and/or synthetic hydrophilic colloid, for example, albumin, casein, polyvinyl alcohol, sodium alginate, sodium carboxymethyl cellulose. The weight ratio of hydrophilic colloid to silver halide (calculated as silver nitrate) generally ranges from 5 to 0.3, preferably from 2 to 0.5. A support is coated such that the coverage of silver halide may be about 0.2 to 5 g/m$^2$, preferably about 0.5 to 3 g/m$^2$ calculated as silver nitrate.

A substratum may be disposed below the silver halide emulsion or nearer to the support for anti-halation and other purposes. Pigments such as carbon black or dye may be contained in the substratum for anti-halation. Such a substratum may contain a developing agent and an auxiliary developing agent.

The support which is coated with the silver halide emulsion includes all types of support commonly used in the art, for example, paper, glass, various types of film such as cellulose acetate film, polyvinyl acetal film, polystyrene film, polypropylene film, polyethylene terephthalate film or composite films such as polyester, polypropylene or polystyrene lamina coated with polyethylene lamina, metals, metallized paper, or metal/paper laminates. Also useful are paper supports coated with $\alpha$-olefin polymer such as polyethylene on one or both surfaces thereof. Anti-halation pigments or dyes may be incorporated in the supports themselves.

On that side of the support which is coated with the silver halide emulsion, there may be thinly coated an uppermost layer of a water permeable binder, for example, methyl cellulose, sodium carboxymethyl cellulose, hydroxyethyl cellulose, hydroxyethyl starch, sodium alginate, polyvinyl alcohol, and polyvinyl pyrrolidone.

In the practice of silver complex diffusion transfer process, a developing agent is often incorporated in a silver halide emulsion layer and/or an image receiving layer or another water permeable layer adjacent thereto as disclosed in UK Patent No. 1,000,115, 1,012,476, 1,017,273 and 1,042,477. For this type of photosensitive material, the processing solution used in the development step may be a developing agent-free solution which is known as an "alkaline activating solution".

The physical development nucleus layer or image receiving layer may be disposed above or below the silver halide emulsion layer, preferably above, more preferably above and contiguous to the silver halide emulsion layer. The term "above" means that side of the silver halide emulsion layer which is remote from the support. Physical development nuclei are provided by well-known chemical compounds, for example, metals such as antimony, bismuth, cadmium, cobalt, palladium, nickel, silver, lead and zinc and sulfides of such metals. The physical development nucleus layer may also contain a hydrophilic colloid such as gelatin, carboxymethyl cellulose, gum arabic, sodium alginate, hydroxyethyl starch, dextrin, hydroxyethyl cellulose, polystyrene sulfonate, vinyl imidazole-acrylamide copolymers, and polyvinyl alcohol.

The image receiving layer may further contain hygroscopic substances such as sorbitol and glycerol as a humectant; pigments such as barium sulfate, titanium dioxide, china clay, and silver for anti-scumming purpose; developing agents such as hydroquinone; and hardeners such as formaldehyde.

A lithographic printing plate is prepared from a photosensitive material by imagewise exposing the photosensitive material, developing it with a diffusion transfer processing solution, and thereafter, processing it with a neutralizing or stabilizing solution. Normally development is carried out at about 20° to 40° C. for about 5 to 60 seconds and neutralization at about 20° to 40° C. for about 5 to 60 seconds. The plate thus prepared may be modified or enhanced ink receptive using the compounds described in JP-B 29723/1973 and U.S. Pat. No. 3,721,559.

With respect to the printing operation, desensitizing solution and fountain solution, conventional well-known techniques may be applied.

EXAMPLE

Examples of the present invention are given below by way of illustration and not by way of limitation.

EXAMPLE 1

A double side polyethylene-coated paper support of 135 g/m$^2$ was coated on one side with a matte layer containing silica particles with a mean particle size of 5 $\mu$m. The support on the other side was treated with a corona discharge, coated with an anti-halation layer containing carbon black, and thereon with an orthochromatically sensitized high-sensitivity silver chloride emulsion containing silica particles with a mean particle size of 5 $\mu$m to a coverage of 1.5 g/m$^2$ of silver nitrate.

Both the anti-halation and emulsion layers contained formalin as a gelatin hardener. The support was dried and then heated at 40° C. for 3 days.

A palladium sulfide sol was prepared from solutions A, B and C.

| Solution A | | |
|---|---|---|
| Palladium chloride | 5 | g |
| Hydrochloric acid | 40 | ml |
| Water | 1 | liter |
| Solution B | | |
| Sodium sulfide | 8.6 | g |
| Water | 1 | liter |
| Solution C | | |
| Methyl vinyl ether-maleic anhydride copolymer (1.25%) | 100 | ml |
| 10% saponin aqueous solution | 200 | ml |
| Water | 18 | liters |

With stirring, solutions A and B were mixed for 30 minutes. The mix solution was passed through a column loaded with a water purifyng ion-exchange resin for purification. Solution C was added to the mix solution. The solution was adjusted to pH 4, obtaining a coating sol. The palladium sulfide sol was coated onto the emulsion layer at a rate of 5 m/min.

The thus prepared photosensitive material, which was an origin of a lithographic printing plate, was exposed imagewise by means of a letterpress camera having an image inversion mechanism and then developed at 30° C. for 20 seconds with an alkaline processing solution of the following composition:

| Water | 750 | ml |
|---|---|---|
| Sodium hydroxide | 15 | g |
| Anhydrous sodium sulfite | 50 | g |
| Hydroquinone | 10 | g |
| 1-phenyl-3-pyrazolidone | 1 | g |
| Additive A* | | |
| Additive B* | | |
| Water totaling to | 1 | liter |

Additives A and B (*) were changed as shown in Table 1.

After development, the material was treated at 25° C. for 20 seconds with a neutralizing solution of the following composition:

| Ethylene glycol | 5 | g |
|---|---|---|
| Colloidal silica (20% aqueous solution) | 1 | g |
| Na$_2$S$_2$O$_3$ | 4 | g |
| NaH$_2$PO$_4$ | 60 | g |
| Na$_2$HPO$_4$ | 10 | g |
| Water totaling to | 1 | liter |

In this way, there were obtained printing plates which are designated Plates 1-1 to 1-7 in accordance with Additives A and B used in development as shown in Table 1.

Each of the printing plates was mounted in an offset press A. B. Dick 350CD (trade mark, by A. B. Dick Company). An etching solution of the following composition:

| Water | 600 | ml |
|---|---|---|
| Isopropanol | 50 | g |
| 3-mercapto-4-acetamide-5-n-butyl-1,2,4-triazole | 1 | g | was thoroughly spread over the plate. The machine was operated for printing while dampening the plate with a 10-fold diluted fountain solution of the following composition:

| Water | 880 | ml |
|---|---|---|
| Succinic acid | 6 | g |
| Boric acid | 8.4 | g |
| Sodium sulfate | 25 | g |
| Ethylene glycol | 100 | g |
| Colloidal silica (20% aqueous solution) | 28 | g |

The plates were evaluated for ink receptivity and plate wear by the following procedures.

Ink receptivity

The ink used was A. B. Dick Offset Ink 3-1012. Paper feed was started at the same time as an inking roller was contacted against the plate. The number of paper sheets fed until an acceptable image density was reached was counted. "None" means that the plate did not receive ink at all.

Plate wear

Printing was continued over 1,000 sheets. The number of acceptably printed paper sheets was counted until ink skips were detected in the image.

The results are shown in Table 1. In Table 1, Additive A represents compounds of formula (I) and Additive B represents a class of silver halide solvents including formula (II) compounds.

TABLE 1

| Printing plate | Additive A (g) | Additive B (g) | Ink receptivity | Plate wear | Remarks |
|---|---|---|---|---|---|
| 1-1* | — | Potassium thiocyanate (20) | 50 | 500 | ** |
| 1-2* | MAHTZ (0.3) | Potassium thiocyante (20) | 40 | 800 | ** |
| 1-3* | — | II-4 (18) | 30 | 800 | — |
| 1-4 | MAHTZ (0.3) | II-4 (18) | 15 | >5000 | — |
| 1-5 | MHOZ (0.8) | II-3 (9.2) | 15 | >5000 | — |
| 1-6* | MAHTZ (0.3) | — | — | — | — |
| 1-7 | MHOZ (0.8) | II-4 (14) + II-6 (5) | 10 | >5000 | — |

MAHTZ: 3-mercapto-4-acetamide-5-n-heptyl-1,2,4-triazole
MHOZ: 2-mercapto-5-heptyl-1,3,4-oxadiazole
*comparison
**(1) Waste solution disposal was restricted.
(2) Metal members of processing equipment were corroded.

As seen from Table 1, those printing plates which had been developed with developers containing both compounds of formulae (I) and (II), that is, Plates 1-4, 1-5 and 1-7, exhibit good ink receptivity and are extremely improved in plate wear as compared with the comparative ones. The inventive plates are free from the corrosion and waste solution disposal problems associated with thiocyanate.

EXAMPLE 2

A double side polyethylene-coated paper support of 135 g/m$^2$ was coated on one side with a matte layer containing silica particles with a mean particle size of 5 μm. The support on the other side was treated with a corona discharge, coated with an anti-halation layer containing 2 g/m² of hydroquinone, 0.1 g/m² of 1-phenyl-4-methyl-4-hydroxymethyl-3-pyrazolidone and carbon black, and thereon with a silver chloride emulsion of the same composition as in Example 1 except for panchromatic sensitization. A palladium sulfide sol (Example 1) was coated onto the emulsion layer, obtaining a photosensitive material which was an origin of a lithographic printing plate.

The photosensitive material was exposed by means of a helium neon laser image setter and then developed at 30° C. for 30 seconds with an alkaline processing solution of the following composition:

| | | |
|---|---|---|
| Sodium hydroxide | 20 g | |
| Anhydrous sodium sulfite | 50 g | |
| Additive A* | | |
| Additive B* | | |
| Water totaling to | 1 liter | |

Additives A and B (*) were changed as shown in Table 2. After development, the material was neutralized with a neutralizing solution as in Example 1.

In this way, there were obtained printing plates which are designated Plates 2-1 to 2-3 in accordance with the Additives A and B used in development as shown in Table 2. They were evaluated by printing as in Example 1. The results are shown in Table 2.

TABLE 2

| Printing plate | Additive A (g) | Additive B (g) | Ink receptivity | Plate wear | Remarks |
|---|---|---|---|---|---|
| 2-1* | MMOZ (0.2) | | Pota | | |

AS seen from Table 2, those printing plates which had been developed with developers containing both compounds of formulae (I) and (II), that is, Plates 2-2 and 2-3, exhibit good ink receptivity and are extremely improved in plate wear as compared with the comparative one. The inventive plates are free from the problems associated with thiocyanate.

According to the present invention, lithographic printing plates having good ink receptivity and minimized plate wear are obtained. The processing solution is easy to handle since it eliminates the problems of corrosion of processing equipment and waste solution disposal.

I claim:

1. A method for preparing a lithographic printing plate from a photosensitive material comprising at least a silver halide emulsion layer and a physical development nucleus layer on a support in accordance with a silver complex diffusion transfer process, said method comprising the steps of:

(a) imagewise exposing the photosensitive material, and (b) developing the silver halide by diffusion transfer processing the photosensitive material in a diffusion transfer alkaline processing solution comprising at least one compound of formula (I) and at least one compound of formula (II) defined below, thereby forming a lithographic printing plate utilizing the transferred silver as an ink receptive site,

wherein Z represents a group of atoms necessary to form a five- or six-membered heterocyclic ring with the nitrogen and carbon atoms, and R is selected from the group consisting of a hydrogen atom, alkyl radical, aryl radical and aralkyl radical,

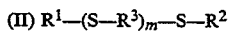

wherein $R^1$ and $R^2$ are independently alkyl radicals or $R^1$ and $R^2$, taken together form a ring, $R^3$ is an alkylene radical which may have an intervening divalent radical, letter m is 0 or an integer of from 1 to 4, and the $R^3$ radicals may be the same or different where m is 2 or more.

* * * * *

UNITED STATES PATENT AND TRADEMARK OFFICE
CERTIFICATE OF CORRECTION

PATENT NO. : 5,391,457
DATED : Feb. 21, 1995
INVENTOR(S) : Katsumi Hayashi

It is certified that error appears in the above-indentified patent and that said Letters Patent is hereby corrected as shown below:

Column 12,

In Claim 1, between lines 20 and 28, delete

and insert therefor

-- (I) 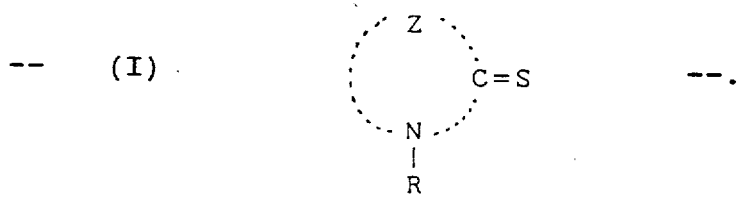 --.

Signed and Sealed this

Sixth Day of June, 1995

Attest:

BRUCE LEHMAN

*Attesting Officer*  *Commissioner of Patents and Trademarks*